(12) United States Patent
Hsieh et al.

(10) Patent No.: US 8,295,018 B2
(45) Date of Patent: Oct. 23, 2012

(54) TRANSMISSION-LINE-BASED ESD PROTECTION

(75) Inventors: Hsieh-Hung Hsieh, Taipei (TW); Po-Yi Wu, Baoshan (TW); Ho-Hsiang Chen, Hsinchu (TW); Chewn-Pu Jou, Chutung (TW); Fu-Lung Hsueh, Cranbury, NJ (US)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 102 days.

(21) Appl. No.: 12/843,082

(22) Filed: Jul. 26, 2010

(65) Prior Publication Data

US 2012/0019968 A1    Jan. 26, 2012

(51) Int. Cl.
*H02H 9/00* (2006.01)
*H01C 7/12* (2006.01)
*H02H 1/00* (2006.01)
*H02H 1/04* (2006.01)
*H02H 3/22* (2006.01)
*H02H 9/06* (2006.01)

(52) U.S. Cl. .......................................... 361/56; 361/118
(58) Field of Classification Search ................... 361/56
See application file for complete search history.

(56) References Cited

U.S. PATENT DOCUMENTS

| 5,969,929 A | 10/1999 | Kleveland et al. | |
| 2006/0057988 A1* | 3/2006 | Kirdhart | 455/189.1 |
| 2008/0112101 A1* | 5/2008 | McElwee et al. | 361/56 |

OTHER PUBLICATIONS

Park, C.K. et al., "Ku-Band Low Noise Amplifier with Using Short-Stub ESD Protection", IEEE MTT-S Digest, 2003, IFTU-89, pp. A157-A160.
Park, J.D. et al., "Ladder-shaped network for ESD protection of millimetre-wave CMOS IC's", Electronics Letters, Jul. 16, 2009, 45(15), 2 pages.

* cited by examiner

*Primary Examiner* — Dharti Patel
(74) *Attorney, Agent, or Firm* — Duane Morris LLP

(57) ABSTRACT

An ESD protection circuit includes a signal pad, a short circuited shunt stub on-chip with and coupled to the signal pad, an open circuited shunt stub on-chip and coupled to the signal pad.

21 Claims, 7 Drawing Sheets

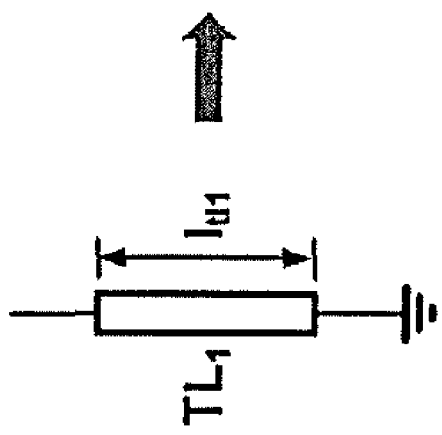
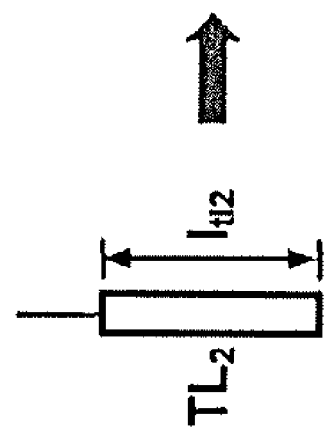
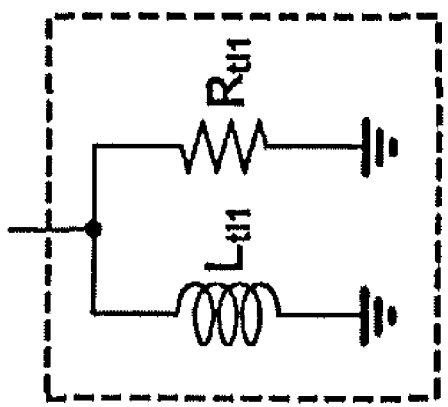
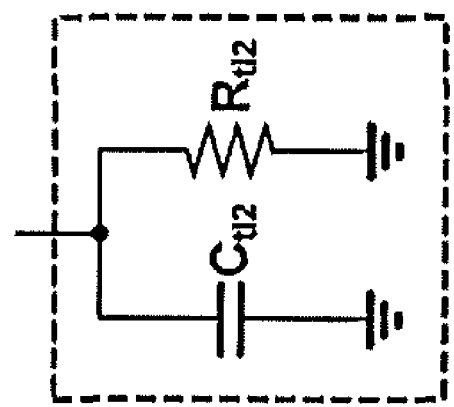
FIG. 5A
FIG. 5B

TRANSMISSION-LINE-BASED ESD PROTECTION

FIELD OF THE INVENTION

The present invention relates to electrostatic discharge (ESD) protection circuits, and more particularly to transmission-line-based ESD protection circuits.

BACKGROUND OF THE INVENTION

An important issue with integrated circuit (IC) design and manufacturing is protecting the on-chip components or devices from ESD. ESD is generally understood to refer to the sudden and momentary electric current that flows between two objects at different electrical potentials. In the electronics industry, the term describes momentary unwanted currents that may cause damage to electronic equipment. Examples of ESD events include sparks caused by static electricity, such as that which can be generated by walking on a rug or removing some types of plastic packaging, or through electrostatic induction, such as when a charged region on the surface of a Styrofoam cup or plastic bag induces potential on a nearby ESD sensitive component. While a spark causes only minor discomfort to people, it leads to severe damage to unprotected integrated circuits such as those made from semiconductor materials, e.g. silicon, and insulating materials such as silicon dioxide. Either of these materials can suffer permanent damage when subjected to the high voltages caused by an ESD event.

ESD protection can incorporated into IC device, where special circuit design techniques are used on the input and output pins of the device. A prior art embodiment widely adopted in the industry is depicted in FIG. 1. The IC device 10 includes an RF circuit 11 connected between a first voltage supply (VDD) pad 13 and a second voltage supply (VSS) pad 15. The RF circuit 11 has an input terminal at node 16 connected to signal pad 18. An ESD clamp circuit 14 is connected between supply pads 13 and 15 in parallel with an ESD block 12. ESD block 12 consists of a pair of bidirectional diodes labeled DP and DN in FIG. 1. Diode DP is connected between the VDD pad 13 and node 16, and the diode DN is coupled between the node 16 and the VSS pad 15.

The ESD protection built into the IC device 10 of FIG. 1 can provide protection against both positive and negative ESD events (positive beyond the power supply node voltage, and negative beyond the power supply return or ground voltage). However, with this design, there is a tradeoff between RF performance and ESD protection. The ESD protection circuit adds parasitic capacitances to the signal node 16. These capacitances decrease the bandwidth of the overall circuit. For sensitive designs, ESD circuits comprised of silicon controlled rectifiers (SCRs) and grounded gate re-channel MOSFETs (ggNMOSs) are used that may help to reduce the parasitic capacitance that is added to the signal node 16. However, high frequency RF and millimeter wave (mmW) applications, i.e. above 10 GHz, are more sensitive to any additional capacitance. As such, this traditional ESD circuit is not well suited for such applications.

Another example of an IC circuit 20 with ESD protection is shown in FIG. 2. The IC circuit 20 of FIG. 2 is identical to IC circuit 10 of FIG. 1 except for ESD block 22. ESD block 22 reduces the parasitic capacitance from the bidirectional diodes DP and DN of FIG. 1 by using a distributed architecture. The ESD block 22 has a plurality of sets of bidirectional diodes $D_{1A}$ to $D_{4A}$ and $D_{1B}$ to $D_{4B}$ as well as transmission lines $TL_1$ to $TL_4$ in the signal path between signal pad 18 and the input to the RF circuit 11. One major concern with this prior art configuration is that the transmission lines $TL_1$ to $TL_4$ are in the signal path from signal pad 18 to the RF circuit input, which leads to high insertion losses. Further, this architecture consumes a great deal of area, even in millimeter wave applications.

Yet another example of an IC circuit with integrated ESD protection is shown in U.S. Patent Publication No. 2008/0112101 A1 to McElwee et al., the entirety of which is hereby incorporated by reference herein. FIG. 3 shows an IC circuit 30 with the ESD protection approach of McElwee et al. McElwee et al. replaces the dual diode structure with an ESD block 32 having a transmission line $TL_1$ coupled between the RF input node 36 and the ground node. The transmission line $TL_1$ (also referred to as a shorted or short circuited stub or shorted shunt transmission line) acts as a filter. That is, the short stub has a high impedance at the operating frequency $f_{RF}$ of the RF circuit, so as to reduce its impact on circuit performance, and a low impedance within the expected ESD pulse spectrum. This configuration has an advantage over the prior art embodiment of FIG. 2 in that it allows desired signals from the signal pad 18 into the RF circuit 11 without significant insertion losses, while shunting unwanted signals from the signal pad 18, such as an ESD event, to ground. Yet improvements are still desired in ESD performance of such ESD devices.

SUMMARY OF THE INVENTION

An ESD protection circuit includes a signal pad, a short circuited shunt stub on-chip with and coupled to the signal pad and coupled thereto, an open circuited shunt stub on-chip with and coupled to the signal pad.

The above and other features of the present invention will be better understood from the following detailed description of the preferred embodiments of the invention that is provided in connection with the accompanying drawings.

BRIEF DESCRIPTION OF THE DRAWINGS

The accompanying drawings illustrate preferred embodiments of the invention, as well as other information pertinent to the disclosure, in which:

FIGS. 5A and 5B illustrate equivalent circuits for the shunt stubs shown in FIGS. 4A-4C.

DETAILED DESCRIPTION

This description of the exemplary embodiments is intended to be read in connection with the accompanying drawings, which are to be considered part of the entire written description. Terms concerning electrical attachments, coupling and the like, such as "connected" and "interconnected," refer to a relationship wherein structures communicate with one another either directly or indirectly through intervening structures, unless expressly described otherwise.

Figure 1:
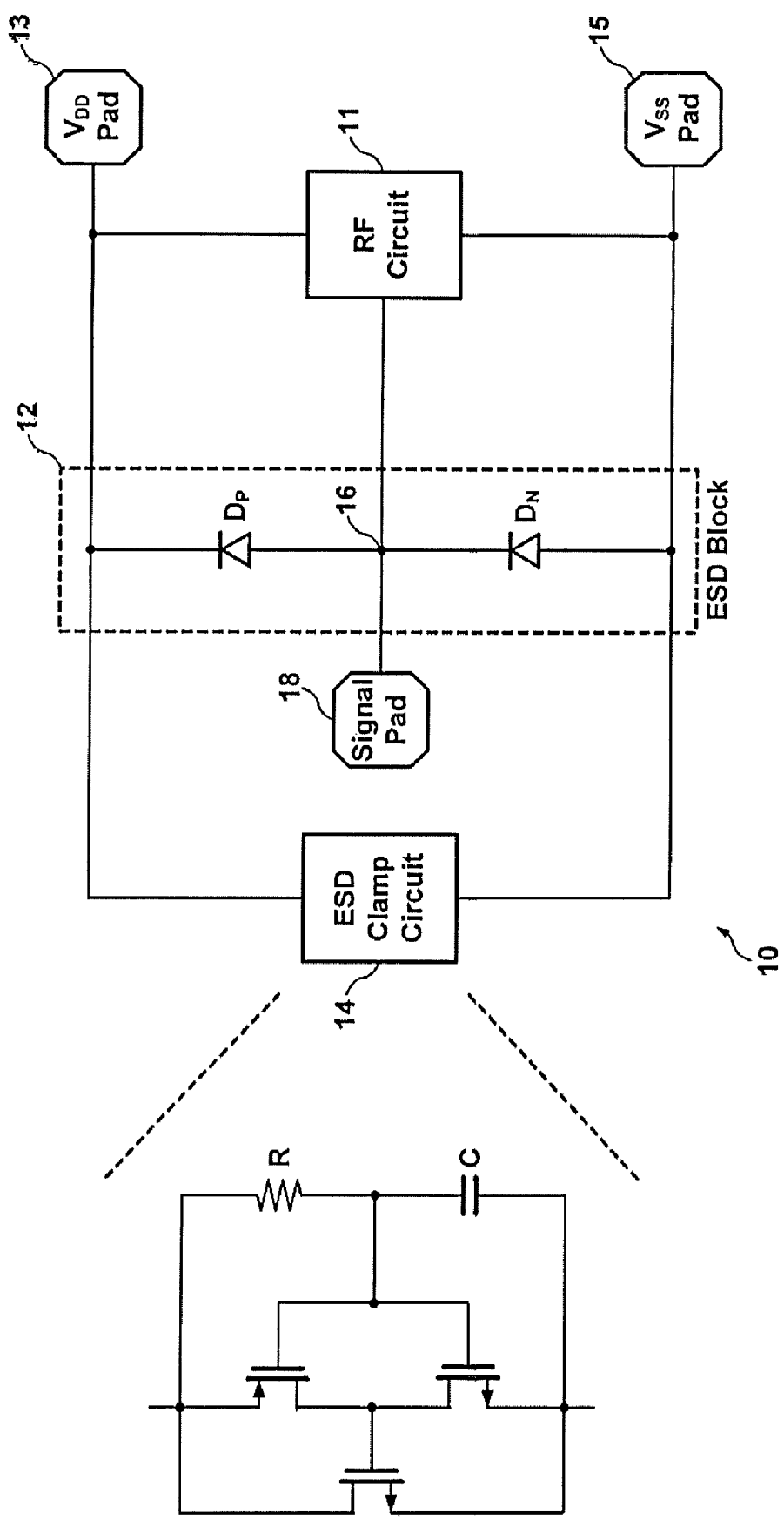
FIG. 1 is a circuit diagram of an integrated circuit having conventional prior art dual-diode ESD protection.
Figure 2:
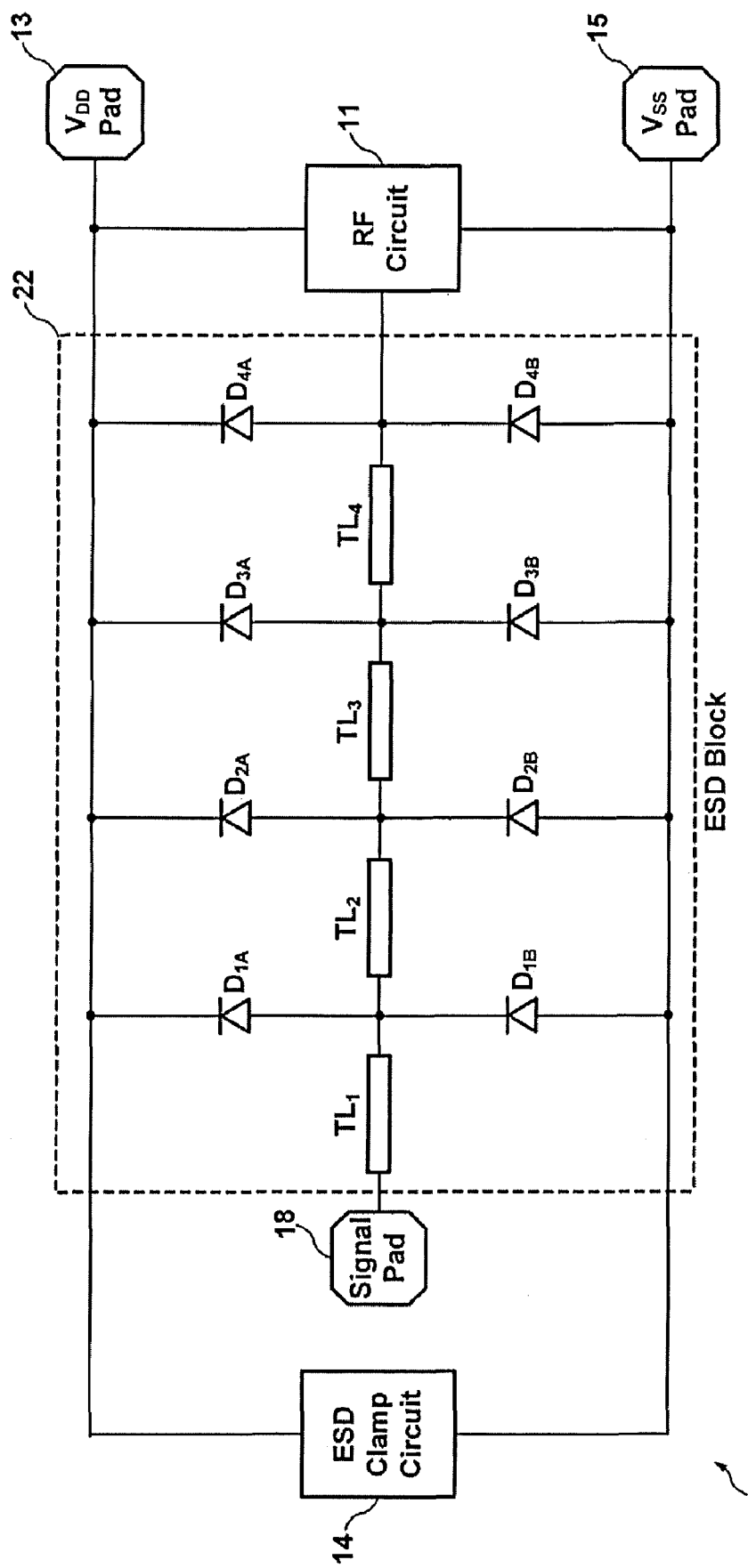
FIG. 2 is a circuit diagram of an integrated circuit having a prior art distributed dual-diode ESD protection architecture.
Figure 3:
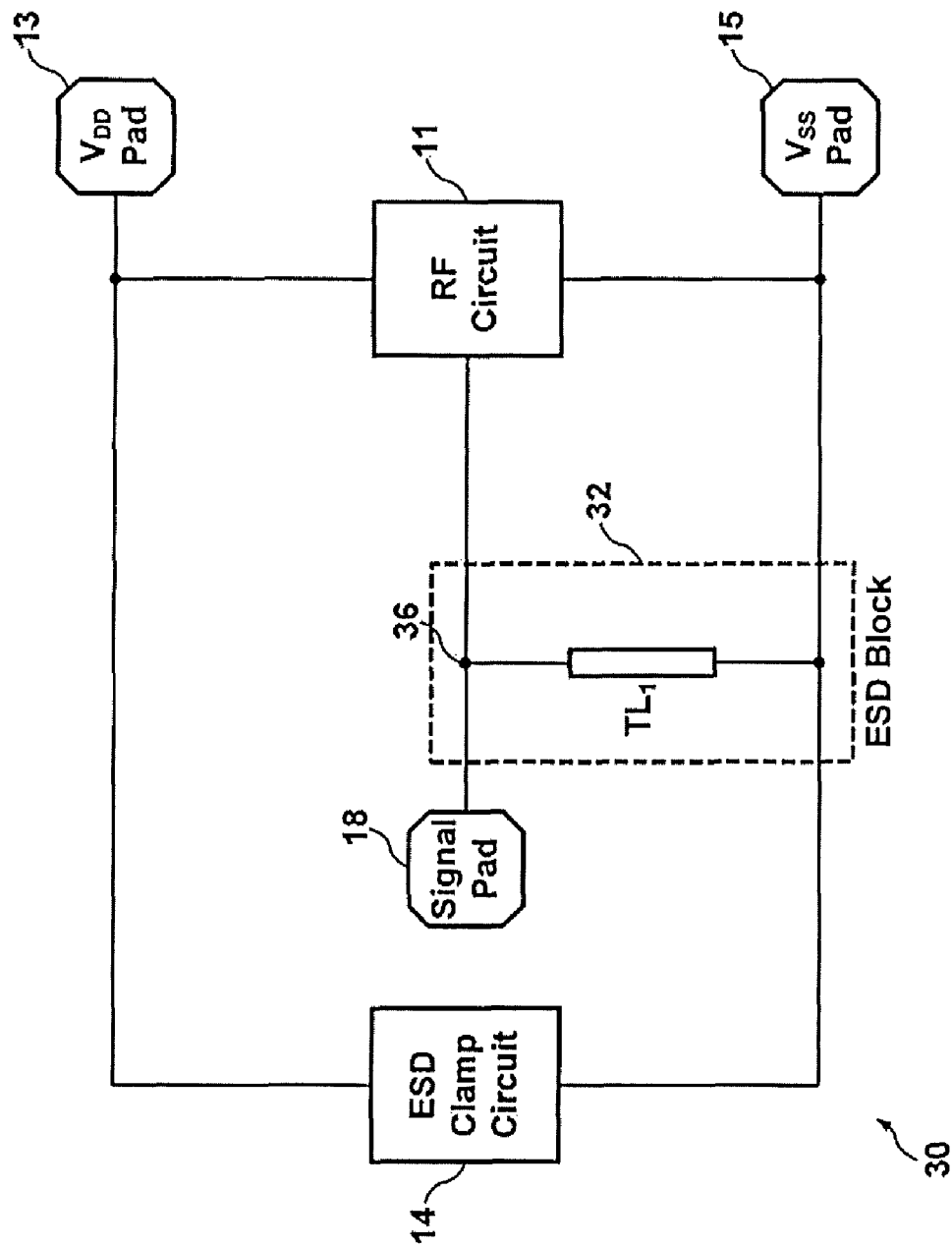
FIG. 3 is a circuit diagram of an integrated circuit having prior art transmission line based ESD protection.
Figure 4A:
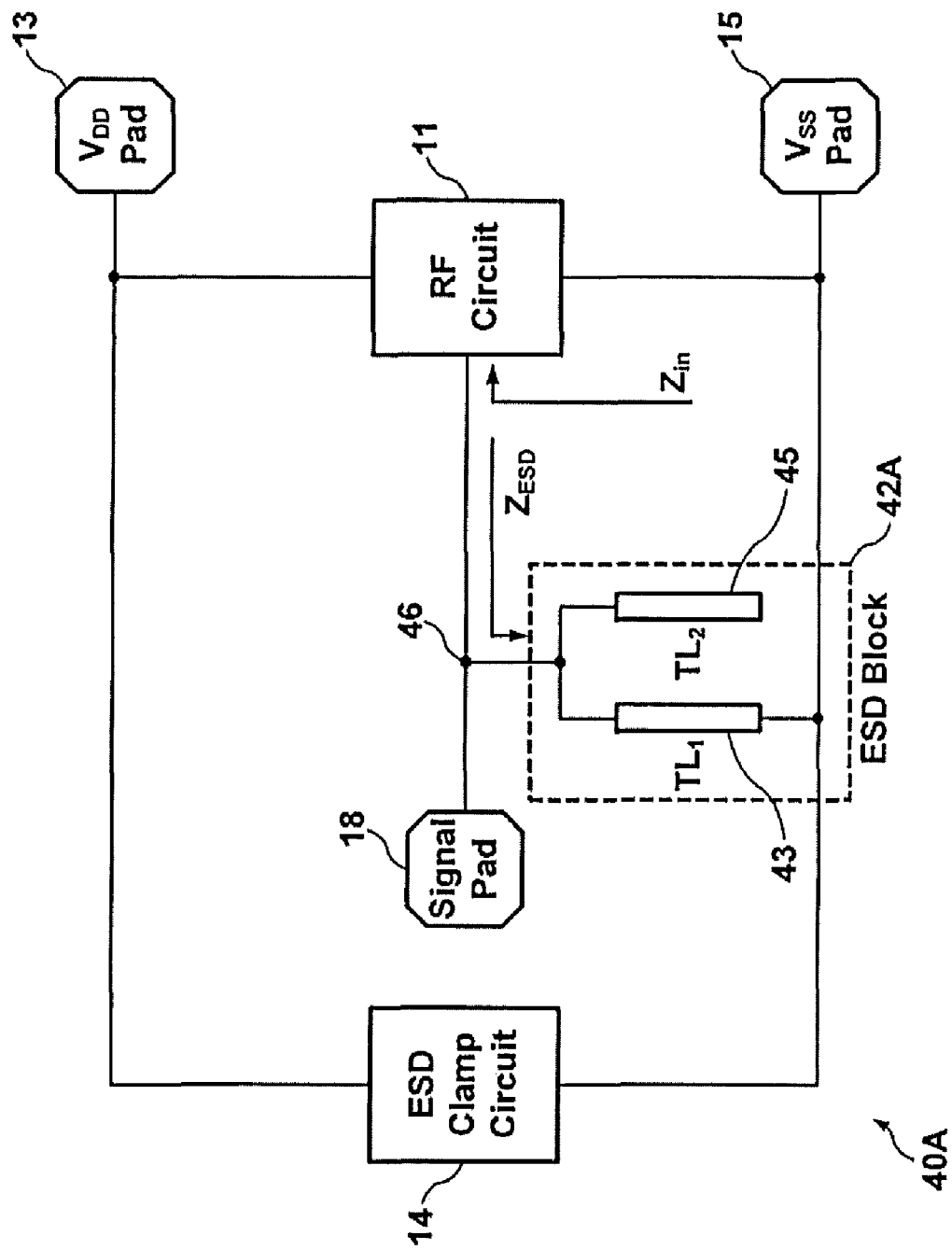
FIG. 4A is a circuit diagram of an integrated circuit device having ESD protection in accordance with an embodiment of the present invention.

FIG. 4A illustrates an integrated circuit device 40A having built-in ESD protection in accordance with an embodiment of the present invention. The components illustrated in FIG. 4A are preferably integrated into a single chip device, i.e., the components are "on-chip." An RF circuit 11 is shown coupled between the VDD pad 13 and the ground (VSS) pad 15 and has an RF input coupled to signal pad 18 through node 46. Note that "ground" as used herein refers to any node that serves as a power supply return for the chip, i.e., it need not be at zero volts. Also, ESD may cause such a ground to "bounce," i.e., its voltage may change during an ESD event. It is for this reason that an additional clamp circuit may be provided. ESD clamp circuit 14 is of a conventional design and provided to protect against PS (positive ESD event on the ground pad) and ND (negative ESD event on the VDD pad) ESD zapping modes.

In embodiments, the RF circuit 11 is a millimeter-wave RF circuit, which has an operating frequency between 30 to 300 GHz. The RF circuit 11 may be a part of devices such as wireless personal area networks (WPAN), which operate around 60 GHz, automotive radar, which operates around 77 GHz, or image sensors, which operate around 90 GHz, to name a few. For low cost, high-level integration and high performance, these millimeter-wave integrated circuits are usually formed using deep submicron CMOS processes, i.e., 0.35 μm and smaller. The thinner gate oxide thickness of these devices are more sensitive to ESD.

An exemplary ESD protection block for the RF circuit 11 operates without altering the RF performance of the device, has good ESD robustness, i.e., ESD protection capability, and is general purpose, meaning it can be used in a variety of circuits without the need for significant (if any) modifications (i.e., "plug and play"). The ESD pulse spectrum for an expected ESD event is typically from DC to less than 10 GHz, and more typically to less than 1 GHz. Since the ESD pulse spectrum is limited to, for example, less than 1 GHz, the ESD device can be designed to have a high impedance at the RF operating frequency ($f_{RF}$) without altering circuit performance and a low impedance within a band of near DC to 1 GHz (or some other value below $f_{RF}$) for ESD protection.

Of particular importance in FIG. 4A is the ESD protection block 42A. As illustrated in FIG. 4A, the ESD protection block 42A includes a short circuited shunt stub 43 in the form of transmission line $TL_1$ and an open circuited shunt stub 45 in the form of transmission line $TL_2$. Transmission line $TL_1$ is DC coupled to the signal pad 18 and the input of the RF circuit 11 at one end at input node 46 and coupled to the VSS pad 15 at the other end. Transmission line $TL_2$ is also DC coupled at one end to input node 46 but its other end is uncoupled (i.e., floating or open). The transmission lines can take on any transmission line form, such as but not limited to a stripline or micro-stripline form, for example. As the ESD event occurs, the low-frequency ESD current shunts to ground through the short circuited shunt stub 43 (i.e., $TL_1$). The short circuited shunt stub 43 and the open circuited shunt stub 45 ($TL_2$) are designed to resonate at the operating frequency $f_{RF}$ of the RF circuit 11, making the ESD block's affect on the circuit performance insignificant at the operating frequency of the RF circuit 11. The total transmission line length of the transmission line pair $TL_1$ and $TL_2$ ($l_{t1}+l_{t2}$) is designed to be at or close to $\lambda/4$ at the operating frequency $f_{RF}$. As shown in FIGS. 5A and 5B, the equivalent circuit of the short circuited shunt stub 43 is an inductor ($L_{t1}$) in parallel with a resistor ($R_{t1}$).

The equivalent circuit of the open circuited shunt stub 45 is a capacitor ($C_{t1}$) in parallel with a resistor ($R_{t2}$). From examination of a Y-Smith chart, it is apparent that when the total transmission line length of the two transmission lines is close to $\lambda/4$ at $f_{RF}$, $L_{t1}$ resonates with $C_{t1}$. As a result, the input impedance $Z_{ESD}$ (labeled in FIG. 4A) of the proposed ESD circuit at the frequency $f_{RF}$ becomes $1/[(R_{t1})^{-1}+(R_{t2})^{-1}]$. By properly choosing the length of the short circuited shunt stub and the open circuited shunt stub, the magnitude of $Z_{ESD}$ at $f_{RF}$ becomes much larger (preferably 10 times or greater) than that of $Z_{in}$ (also labeled in FIG. 4A), rendering the affect of the ESD circuit on the RF circuit performance at $f_{RF}$ negligible.

Alternatively, $TL_1$ can be configured such that its equivalent circuit is a capacitor in parallel with a resistor and $TL_2$ can be configured such that its equivalent circuits is an inductor in parallel with a resistor. However, in this configuration the total length of TL1 and TL2 should be set to $3\lambda/4$, as opposed to $\lambda/4$.

The ESD protection block 42A of FIG. 4A provides a transmission-line based ESD protection that is well suited for millimeter-wave applications. Using the combination of a short circuited shunt stub and an open circuited shunt stub, a low-frequency ESD current from an ESD event can be shunted to ground through the short circuited shunt stub while the proposed ESD circuit behaves as a high impedance at the operation frequency of the protected RF circuit and thus cannot influence the circuit performance significantly. Compared with distributed ESD protection architectures discussed above, the insertion loss is minimized with the new ESD protection approach. Compared with ESD protection architectures that utilize only short circuited shunt stubs, the use of the open circuit shunt stub in addition to a short circuited shunt stub allows the length of the short circuited shunt stub to be smaller, leading to better ESD protection. McElwee et al. provides no information about the length of shorted-shunt transmission line but if McElwee's ESD structure were designed for the general purpose of RF circuits operating at a RF frequency of $f_{RF}$ (that is, plug-and-play), the length of the short-circuited stub should be chosen around quadrature wavelength at $f_{RF}$ such that the input impedance of $Z_{ESD}$ becomes large and the ESD device would have an insignificant impact on RF performance. However, since the length of the shorted stub has only one choice at $f_{RF}$ (that is, quadrature wavelength), the ESD performance has no room for improvement.

With the introduction of an additional open stub, once the total length of the open-circuited and short-circuited stubs is designed around quadrature wavelength at a RF frequency of $f_{RF}$, the proposed ESD structure can provide plug-and-play functionality. As a result, the ESD performance has extra room or flexibility for improvement; that is, the length of the short stub can be changed. Typically, with the decrease of the length of the short stub, the metal loss from this transmission line is reduced, leading to low IR drop and better ESD protection. However, as the length of short-circuited stub is further decreased (requiring the length of open-circuited stub to be further increased while the quadrature wavelength is still met), although the high impedance of ZESD can be still obtained, the impedance cannot be as large as that in the case of a longer short-circuited stub. As a result, there is a tradeoff between ESD protection and RF performance and a compromise solution can be determined depending on the design specification. It is noted that, this tradeoff cannot be made with the design of McElwee.

Figure 4B:
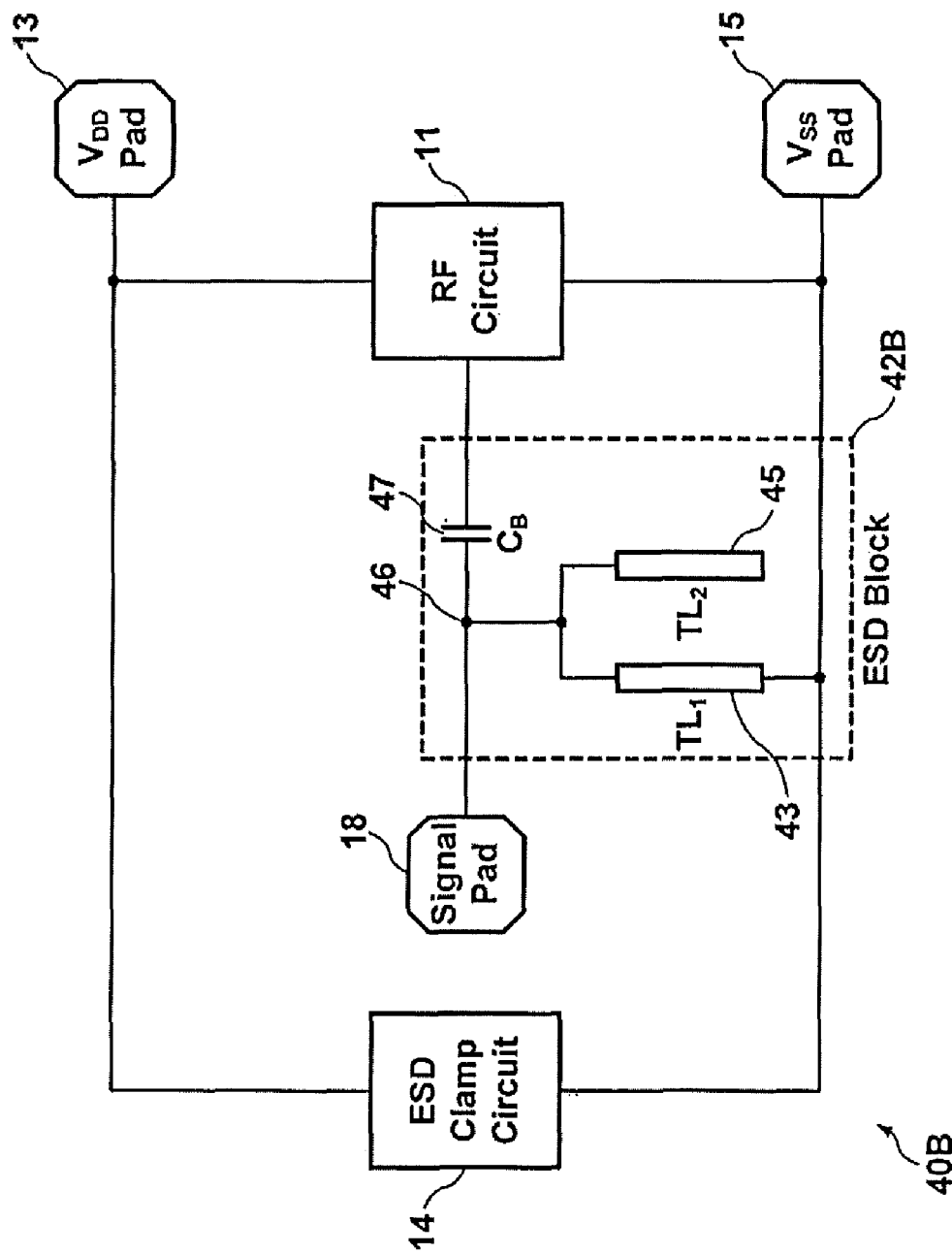
FIG. 4B illustrates an integrated circuit device having an alternative embodiment of an ESD protection block in accordance with the present invention.

FIG. 4B illustrates an integrated circuit device 40B having an alternative embodiment of an ESD block 42B. The ESD block 42B is identical to the ESD block 42A except for the addition of DC blocking capacitor 47 (labeled $C_B$) connected between the node 46 and the input to the RF circuit 11. Since node 46 is connected to ground through the transmission line $T_{L1}$ of ESD block 42B, capacitor 47 may be used when the RF circuit 11 has no input DC blocking capacitor for preventing DC coupling to the RF circuit.

Figure 4C:
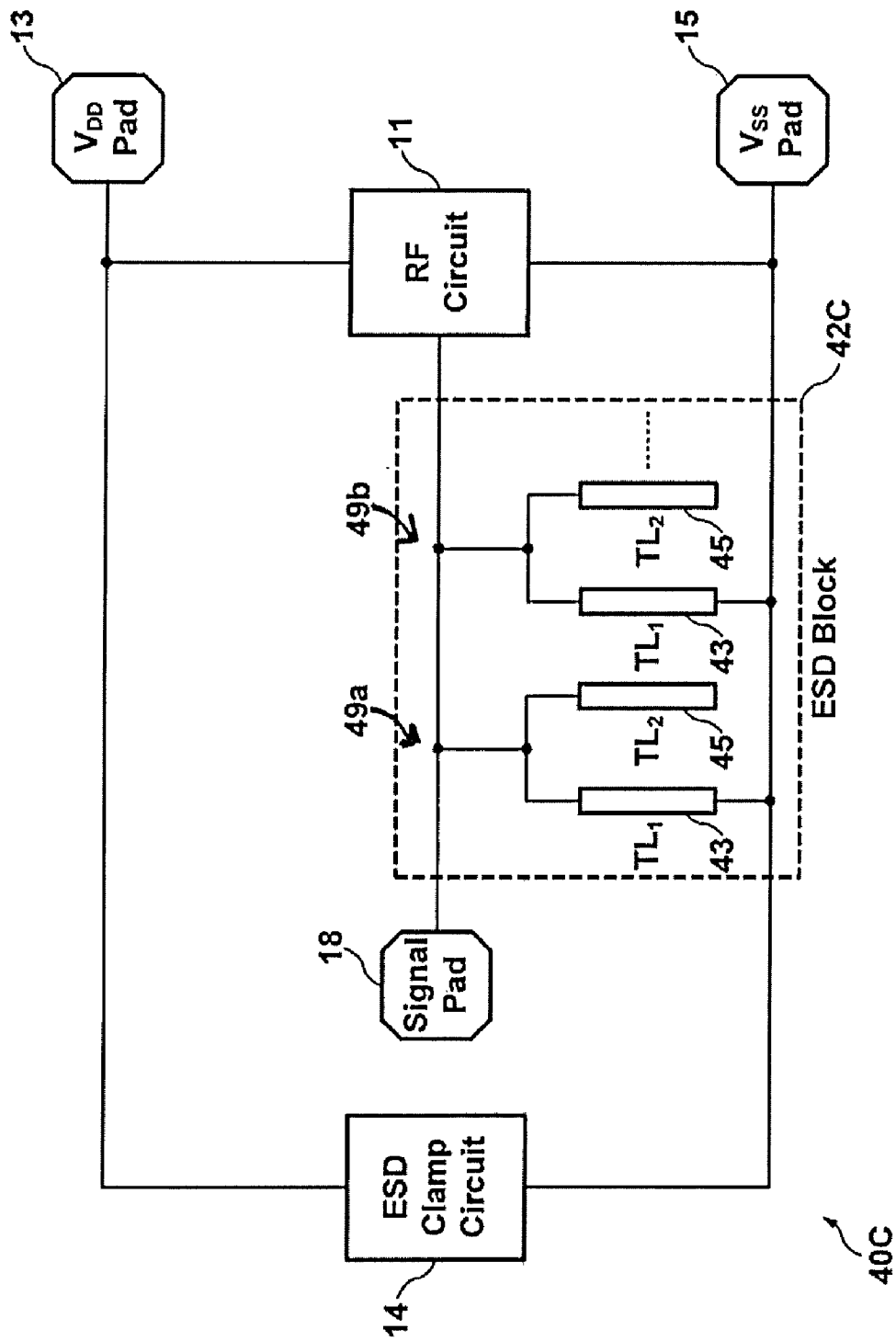
FIG. 4C illustrates an integrated circuit device having another alternative embodiment of an ESD protection block in accordance with the present invention.

FIG. 4C illustrates an integrated circuit device 40C having another alternative embodiment of an ESD block 42C. The ESD block 42C has cascaded pairs 49a, 49b of shunt stubs with each pair including a short circuited shunt stub 43 and an open circuited shunt stub 45. Although only two pairs of stubs 49a, 49b are shown, it should be understood that more than two pairs may be provided depending on design needs. As with the single pair of shunt stubs illustrated in FIGS. 4A and 4B, each pair 49 has transmission lines that are sized such that their total length is about λ/4 at the $f_{RF}$ of the RF circuit 11. While each pair's total length is λ/4, the lengths of the transmission lines $T_{L1}$ differ from pair to pair, and as such so do the lengths of the transmission lines $T_{L2}$. For example, the first pair 49a may have transmission lines each having a length of λ/8 for a total length of λ/4, while the second pair may have transmission lines having a length of 3λ/16 and λ/16, again for a total length of λ/4. Improved ESD protection can be provided since the multiple short-circuited stubs can distribute current and shunt the currents to ground, leading to better ESD protection.

As described above, the integrated circuit components of the integrated circuit chip can be fabricated in a CMOS fabrication process, such as a 0.35 micron, 0.13 micron, 90 nm or smaller CMOS process. Alternatively, the integrated circuit may be implemented by other microelectronic fabrication processes, including for example a 0.18 micron, SiGe bipolar CMOS process.

Although the invention has been described in terms of exemplary embodiments, it is not limited thereto. Rather, the appended claims should be construed broadly to include other variants and embodiments of the invention that may be made by those skilled in the art without departing from the scope and range of equivalents of the invention.

What is claimed is:

1. An ESD protection circuit comprising:
   a signal pad;
   a short circuited shunt stub on-chip with the signal pad and coupled thereto; and
   an open circuited shunt stub on-chip with the signal pad and coupled thereto.

2. The ESD protection circuit of claim 1, wherein the short circuited shunt stub is a first transmission line having a first length, and the open circuited shunt stub is a second transmission line having a second length.

3. The ESD protection circuit of claim 2, wherein a sum of the first and second lengths is equal to about one-quarter of a wavelength with respect to an operating frequency of an RF circuit coupled to the signal pad.

4. The ESD protection circuit of claim 1,
   wherein in the presence of a low frequency ESD event the short circuited shunt stub is configured to shunt ESD current to ground, and
   wherein the short circuited shunt stub and open circuited shunt stub are configured to resonate at a RF frequency above the low frequency ESD event.

5. The ESD protection circuit of claim 4, wherein the low frequency ESD event is somewhere above DC and below 10 GHz.

6. The ESD protection circuit of claim 5, wherein the low frequency ESD event is below 1 GHz.

7. The ESD protection circuit of claim 6, wherein the RF frequency is between 30 to 300 GHz.

8. The ESD protection circuit of claim 1, wherein the short circuited shunt stub and open circuited shunt stub form a first pair of shunt stubs, the ESD protection circuit further comprising at least one second pair of shunt stubs comprising:
   at least one second short circuited shunt stub on-chip with and coupled to the signal pad; and
   a least one second open circuited shunt stub on-chip with and coupled to the signal pad.

9. The ESD protection circuit of claim 8,
   wherein each of the short circuited shunt stubs is a transmission line having a transmission line length, and each of the open circuited shunt stubs is a transmission line having a transmission line length,
   wherein a total length of the transmission lines of the each pair of shunt stubs is equal to about one-quarter of a wavelength with respect to an operating frequency of an RF circuit coupled to the signal pad.

10. The ESD protection circuit of claim 8, wherein the short circuited shunt stubs from the first pair of shunt stubs differs in length from the second short circuited shunt stub of the second pair of shunt stubs.

11. The ESD protection circuit of claim 1, further comprising a DC blocking capacitor coupled to the signal pad.

12. An integrated circuit chip, comprising:
   a signal pad;
   a first power supply pad;
   a second power supply pad;
   an RF circuit coupled between the first and second power supply pads and having an input coupled to the signal pad;
   an ESD clamp circuit coupled between the first and second power supply pads; and
   an ESD protection block comprising:
      a short circuited shunt stub coupled to the signal pad; and
      an open circuited shunt stub coupled to the signal pad.

13. The integrated circuit chip of claim 12,
   wherein the RF circuit has an operating frequency, the operating frequency being higher than an expected low frequency ESD event;
   wherein in the presence of the low frequency ESD event the short circuited shunt stub is configured to shunt ESD current to ground; and
   wherein the short circuited shunt stub and open circuited shunt stub are configured to resonate at the operating frequency of the RF circuit.

14. The integrated circuit chip of claim 13,
   wherein the short circuited shunt stub is a first transmission line having a first length, and the open circuited shunt stub is a second transmission line having a second length; and
   wherein a sum of the first and second lengths is equal to about one-quarter of a wavelength with respect to the operating frequency of the RF circuit.

15. The integrated circuit chip of claim 13,
   wherein the expected low frequency ESD event is somewhere above DC and below 1 GHz, and the RF frequency is between 30 to 300 GHz.

16. The integrated circuit chip of claim 12,
   wherein the short circuited shunt stub and open circuited shunt stub form a first pair of shunt stubs, the ESD protection circuit further comprising at least one second pair of shunt stubs comprising at least one second short circuited shunt stub coupled to the signal pad and a least one second open circuited shunt stub coupled to the signal pad, wherein each of the short circuited shunt stubs is a transmission line having a respective transmission line length, and each of the open circuited shunt stubs is a transmission line having a respective transmission line length, wherein a total length of the transmission lines of the each pair of shunt stubs is equal to about one-quarter of a wavelength with respect to the operating frequency of an RF circuit coupled to the signal pad, and the short circuited shunt stub from the first pair of shunt stubs differs in length from the second short circuited shunt stub of the second pair of shunt stubs.

17. The ESD protection circuit of claim 12, further comprising a DC blocking capacitor coupled between the signal pad and the input of the RF circuit.

18. An integrated circuit chip, comprising:
a signal pad;
an on-chip millimeter wave (mmW) circuitry having an input terminal coupled to the signal pad;
an on-chip electrostatic discharge protection (ESD) block coupled to the signal pad, the ESD protection block comprising a short circuited shunt stub coupled to the signal pad and an open circuited shunt stub coupled to the signal pad, wherein the ESD protection circuit provides a low impedance path to ground in the presence of an undesired ESD signal that is received at the signal pad below an operating frequency of the mmW circuitry and a high impedance path to ground at the operating frequency of the mmW circuitry to pass a desired signal at the signal pad to the input terminal of the mmW circuitry.

19. The integrated circuit chip of claim 18, wherein the undesired ESD signal is somewhere above DC and below 1 GHz.

20. The integrated circuit chip of claim 18,
wherein the short circuited shunt stub and open circuited shunt stub are configured to resonate at the operating frequency of the mmW circuitry.

21. The integrated circuit chip of claim 20,
wherein the short circuited shunt stub is a first transmission line having a first length, and the open circuited shunt stub is a second transmission line having a second length; and
wherein a sum of the first and second lengths is about equal to one-quarter of a wavelength with respect to the operating frequency of the mmW circuitry.

* * * * *

UNITED STATES PATENT AND TRADEMARK OFFICE
CERTIFICATE OF CORRECTION

PATENT NO. : 8,295,018 B2
APPLICATION NO. : 12/843082
DATED : October 23, 2012
INVENTOR(S) : Hsieh-Hung Hsieh et al.

It is certified that error appears in the above-identified patent and that said Letters Patent is hereby corrected as shown below:

Column 1, Lines 53-54, delete "re-channel" and insert -- n-channel --.

Signed and Sealed this
Nineteenth Day of February, 2013

Teresa Stanek Rea
*Acting Director of the United States Patent and Trademark Office*